United States Patent [19]
Nakamura et al.

[11] Patent Number: 5,721,196
[45] Date of Patent: Feb. 24, 1998

[54] STACKED TUNNELING AND STEPPED GRAIN BOUNDARY JOSEPHSON JUNCTION

[75] Inventors: Takao Nakamura; Michitomo Iiyama, both of Osaka, Japan

[73] Assignee: Sumitomo Electric Industries, Ltd., Osaka, Japan

[21] Appl. No.: 698,763

[22] Filed: Aug. 16, 1996

Related U.S. Application Data

[63] Continuation of Ser. No. 334,021, Nov. 2, 1994, abandoned, which is a continuation-in-part of Ser. No. 987,483, Dec. 2, 1992, abandoned.

[30] Foreign Application Priority Data

| Feb. 12, 1991 | [JP] | Japan | 3-343938 |
| Feb. 12, 1991 | [JP] | Japan | 3-343939 |
| Nov. 13, 1991 | [JP] | Japan | 4-328918 |

[51] Int. Cl.$^6$ .......... H01L 39/06; H01L 39/08; H01L 39/14; H01L 39/22
[52] U.S. Cl. .......... 505/237; 505/190; 505/234; 505/238; 505/329; 505/702; 257/31; 257/34
[58] Field of Search .......... 257/31, 32, 33, 257/34, 35, 36; 505/874

[56] References Cited

U.S. PATENT DOCUMENTS 5,106,823  4/1992  Creuzet et al. .......... 505/1

FOREIGN PATENT DOCUMENTS

| 58-89877 | 5/1983 | Japan | 505/874 |
| 63-95684 | 4/1988 | Japan | 257/35 |
| 6-21521 | 1/1994 | Japan | 257/36 |

OTHER PUBLICATIONS

Bourne et al., "High–Temperature Superconducting Josephson Mixers From Deliberate Gram Boundaries in $Tl_2CaBa_2Cu_2O_8$", SPIE vol. 1477 Superconductivity Applications for Infrared and Microwave Devices, 1991, pp. 205–208.

*Primary Examiner*—Mahshid D. Saadat
*Assistant Examiner*—Alice W. Tang
*Attorney, Agent, or Firm*—John C. Kerins; Kerkam, Stowell, Kondracki & Clarke, P.C.

[57] ABSTRACT

A Josephson junction device comprises a single crystalline substrate including a principal surface, an oxide layer formed on the principal surface of the substrate having a step on its surface and an oxide superconductor thin film formed on the surface of the oxide layer. The oxide superconductor thin film includes a first and a second portions respectively positioned above and below the step of the oxide layer, which are constituted of single crystals of the oxide superconductor, and a step-edge junction made up of a grain boundary on the step of the oxide layer, which constitutes a weak link of the Josephson junction.

4 Claims, 5 Drawing Sheets

1 SUBSTRATE

3 OXIDE LAYER
1 SUBSTRATE 32  33  31
t
3 OXIDE LAYER
1 SUBSTRATE

2 OXIDE SUPERCONDUCTOR THIN FILM
22  23  21
32      31
3 OXIDE LAYER
1 SUBSTRATE
33

STACKED TUNNELING AND STEPPED GRAIN BOUNDARY JOSEPHSON JUNCTION

This application is a continuation of application Ser. No. 08/334,021; filed No. 2, 1994, now abandoned which is a continuation-in-part of application Ser. No. 07/987,483, filed Dec. 2, 1992, now abandoned.

BACKGROUND OF THE INVENTION

1. Field of the Invention

The present invention relates to a Josephson junction device formed of oxide superconductor material and a process for preparing the Josephson junction device, and more specifically to a Josephson junction device of an oxide superconductor, of which a barrier of the weak link is constituted of a grain boundary and a process for preparing the Josephson junction device.

2. Description of Related Art

A Josephson junction device, which is a type of superconducting device, can be realized in various structures. Among the various structures, the most preferable structure in practice is a stacked junction realized by a thin non-superconductor layer sandwiched between a pair of superconductors. However, point contact type junctions, Dayem bridge type junctions and variable thickness bridge type junctions, which are composed of pairs of superconductor regions weakly linked to each other, also exhibit Josephson effect. In general, these Josephson junctions have fine structures in which the superconductor and/or non-superconductor are composed of thin films.

In order to realize a stacked type junction by using an oxide superconductor, a first oxide superconductor thin film, a non-superconductor thin film and a second oxide superconductor thin film are stacked on a substrate in the named order.

In the above-mentioned stacked type junction, an insulator, for example, MgO etc., a semiconductor, for example, Si etc., and a metal, for example, Au etc., are used for the non-superconductor layers so that each superconducting junction has different properties for each application.

The thickness of the non-superconductor layer of the stacked type junction is determined by the coherence length of the superconductor. In general, the thickness of the non-superconductor layer of the stacked type junction must be within a few times of the coherence length of the superconductor. On the other hand, oxide superconductor materials have a very short coherence length, therefore, a thickness of a non-superconductor layer must be about a few nanometers.

The superconductor layers and the non-superconductor layer of the stacked type junction must also be of high crystallinity for favorable junction properties, and should be composed of single crystals or composed of polycrystals which are orientated in almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a Dayem bridge type junction or a variable thickness bridge type junction using oxide superconductor material, very fine processings which realize a weak link of a pair of superconductors are necessary. It is very difficult to conduct a fine processing with good repeatability.

The point contact type junction has been formed of two oxide superconductor thin films which are in contact with each other in a extremely small area which constitutes the weak link of the Josephson junction.

The Dayem bridge type junction has been formed of a constant thickness oxide superconductor thin film which is formed on a substrate and which is patterned in a plan view, so that a superconductor thin film region having a greatly narrowed width is formed between a pair of superconductor thin film regions having a sufficient width. In other words, the pair of superconductor thin film regions having a sufficient width are coupled to each other by the superconductor thin film region having the greatly narrowed width. Namely, a weak link of the Josephson junction in the superconductor thin film is formed at the greatly narrowed width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, the characteristics of the Josephson device have a close relation to the contact area of the superconductor thin film in the point contact type Josephson device, to the width of the superconductor thin film region having the extremely narrowed width in the Dayem bridge type Josephson device, and to the thickness of the thinned oxide superconductor thin film portion in the variable thickness bridge type Josephson device, each of which forms the weak link of the Josephson junction. Therefore, in order to obtain the desired characteristics with a good repeatability, a high precision on a sub-micron level of the processing, such as the etching, is required.

The Dayem bridge type Josephson device can be said to be more preferable than the variable thickness bridge type Josephson device, since the Dayem bridge type Josephson device has a relatively planar surface, which is preferred in a integrated circuit. However, in order to form the weak link in the Dayem bridge type Josephson device, it is required to pattern an oxide superconductor thin film having the thickness on the order of 0.5 μm to 1.0 μm into a width of not greater than 0.2 μm. It is very difficult to conduct this fine patterning with good repeatability.

On the other hand, in the variable thickness bridge type Josephson device, the very fine patterning is not required in order to form the weak link. However, it is very difficult to uniformly control the remaining thickness of the thinned portion forming the weak link. In addition, the variable thickness bridge type Josephson device cannot have a planar surface by nature. This is not preferable to the integrated circuit application.

Therefore, in the prior art, it is almost impossible to manufacture a superconducting device which has multiple homogeneous Josephson junctions by using an oxide superconductor.

In order to resolve the above mentioned problems, a so-called step type Josephson junction device is proposed in the prior art. A Josephson junction device of this type comprises a substrate which includes a step on a principal surface and an oxide superconductor thin film formed on the principal surface of the substrate. The oxide superconductor thin film has a grain boundary at the step portion so that the oxide superconductor thin film is separated into two parts above and below the step which are linked weakly by the grain boundary. Each of the parts constitutes a superconducting electrode and the grain boundary constitutes a weak link of a Josephson junction. Thus, the above oxide superconductor thin film constitutes a Josephson junction device.

No fine processing which is required to manufacture a point contact type Josephson junction device, a Dayem bridge type Josephson junction device or a variable thickness bridge type Josephson junction device is necessary to manufacture the step type Josephson junction device. However, crystalline directions of the two parts of the oxide superconductor thin film sometimes become different from each other so that too large interfacial energy and unnecessary electrical resistance are generated at the step portion, which spoil the characteristics of the Josephson junction. This difference of the crystalline directions is considered to be caused by deformation of crystalline lattices of an etched surface of the substrate.

SUMMARY OF THE INVENTION

Accordingly, it is an object of the present invention to provide a step type Josephson junction device composed of an oxide superconductor material, which has overcome the above-mentioned defects of the conventional ones.

Another object of the present invention is to provide a Josephson junction device composed of an oxide superconductor material which includes multiple homogeneous Josephson junctions.

Another object of the present invention is to provide a method for manufacturing a Josephson junction device with good repeatability by using already established processing techniques.

The above and other objects of the present invention are achieved in accordance with the present invention by a Josephson junction device comprising a single crystalline substrate including a principal surface, an oxide layer formed on the principal surface of the substrate having a step on its surface, and an oxide superconductor thin film formed on the surface of the oxide layer, which includes a first and a second portions respectively positioned above and below the step of the oxide layer, which are constituted of single crystals of the oxide superconductor, and a grain boundary on the step of the oxide layer, which constitutes a weak link of the Josephson junction.

In a preferred embodiment, the oxide layer is formed of an oxide which has a crystalline structure similar to the oxide superconductor, such as $Pr_1Ba_2Cu_3O_{7-y}$ oxide.

In a preferred embodiment, the oxide superconductor is formed of high-$T_c$ (high critical temperature) oxide superconductor, particularly, formed of a high-$T_c$ copper-oxide type compound oxide superconductor, for example, a Y—Ba—Cu—O compound oxide superconductor material, a Bi—Sr—Ca—Cu—O compound oxide superconductor material, or a Tl—Ba—Ca—Cu—O compound oxide superconductor material.

According to another aspect of the present invention, there is provided a Josephson junction device comprising a single crystalline substrate including a principal surface, an oxide layer formed on the principal surface of the substrate having a step on its surface, oxide superconductor thin films and oxide thin films of the same thickness alternately formed on the surface of the oxide layer, in which each oxide superconductor thin film includes a first and a second portion respectively positioned above and below the step of the oxide layer, which are constituted of single crystals of the oxide superconductor, and a grain boundary on the step of the oxide layer, which constitutes a weak link of the Josephson junction.

It is preferable that the height of the step of the oxide layer is the same as the thickness of the oxide superconductor thin film and oxide thin film. In this case, the adjoining oxide superconductor thin films can constitute Josephson junctions.

The oxide thin film is preferably formed of $Pr_1Ba_2Cu_3O_{7-y}$ oxide, for the same reasons mentioned above.

According to still another aspect of the present invention, there is provided a method for manufacturing a Josephson junction device comprising the steps of forming an oxide layer on a principal surface of the single crystalline substrate, etching a portion of the oxide layer so that a step is formed on the surface of the oxide layer and forming an oxide superconductor thin film on the surface of the oxide layer so that the oxide superconductor thin film includes a first and a second portions respectively positioned above and below the step of the oxide layer, which are constituted of single crystals of the oxide superconductor, and a grain boundary between said two portions, which constitutes a weak link of the Josephson junction.

According to another aspect of the present invention, there is provided a method for manufacturing a Josephson junction device comprising the steps of forming an oxide layer on a principal surface of the single crystalline substrate, etching a portion of the oxide layer so that a step is formed on the surface of the oxide layer, forming an oxide superconductor thin film on the surface of the oxide layer and an oxide thin film having the same thickness as that of the oxide superconductor thin film on the oxide superconductor thin film and repeating forming oxide superconductor thin films and oxide thin films so that the oxide superconductor thin films and oxide thin films are stacked alternately and each of the oxide superconductor thin films includes a first and a second portion respectively positioned above and below the step of the oxide layer, which are constituted of single crystals of the oxide superconductor, and a grain boundary between a pair of the upper and lower portions, which constitutes a weak link of the Josephson junction.

In one preferred embodiment, the step of the oxide layer is formed so as to have the same height as the thickness of the oxide superconductor thin films and oxide thin films.

The above and other objects, features and advantages of the present invention will be apparent from the following description of preferred embodiments of the invention with reference to the accompanying drawings.

DETAILED DESCRIPTION OF THE PREFERRED EMBODIMENTS

Embodiment 1

Referring to FIGS. 1A to 1D, a first embodiment of the process in accordance with the present invention for manufacturing the Josephson device in accordance with the present invention will be described.

Figure 1A:
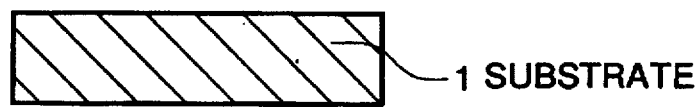
FIGS. 1A to 1D are diagrammatic views for illustrating a first embodiment of the process for manufacturing the Josephson junction device in accordance with the present invention.

As shown in FIG. 1A, an MgO (100) single crystalline substrate 1 having a substantially planar principal surface ((100) surface) was prepared. In this embodiment, the MgO substrate had a size of 15 mm×8 mm and a thickness of 0.5 mm. The MgO substrate 1 was heated to a temperature of 1100° C. and under $O_2$ atmosphere for 8 hours in order to clean its surface. This heat-treatment was not necessary, if the surface of the MgO substrate 1 was clean enough.

Figure 1B:
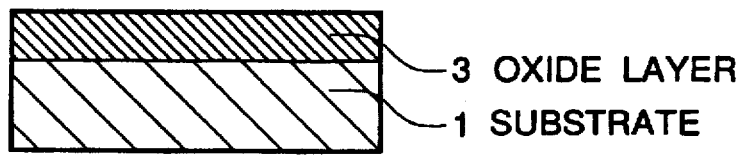

Then, as shown in FIG. 1B, a $Pr_1Ba_2Cu_3O_{7-y}$ oxide layer 3 having a thickness of 200 nanometers was formed on the MgO substrate 1 by sputtering. The conditions of the sputtering process were as follows:

| Temperature of substrate | | 750° C. |
|---|---|---|
| Sputtering gases | Ar | 9 sccm |
| | $O_2$ | 1 sccm |
| Pressure | | $5 \times 10^{-2}$ Torr |

The $Pr_1Ba_2Cu_3O_{7-y}$ oxide layer 3 can also be formed by MBE (molecular beam epitaxy), vacuum evaporation, laser ablation, etc., for example.

Figure 1C:
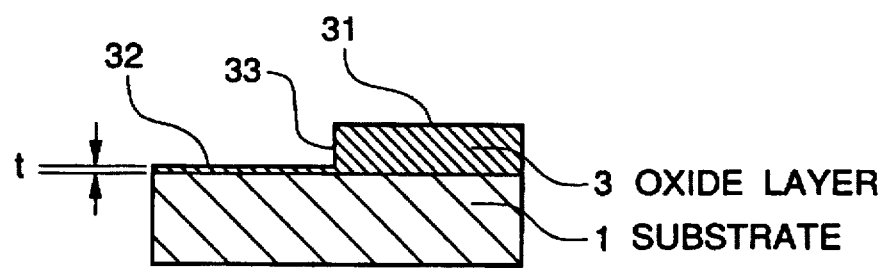

Thereafter, as shown in FIG. 1C, a portion 32 of the $Pr_1Ba_2Cu_3O_{7-y}$ oxide layer 3 was etched by an ion milling using Ar ions so as to form a step 33. The step 33 had a height of 150 nanometers. The $Pr_1Ba_2Cu_3O_{7-y}$ oxide layer 3 can be etched by a reactive ion etching or wet etching. In this connection, the etched portion 32 of the $Pr_1Ba_2Cu_3O_{y-7}$ oxide layer 3 should have a thickness t thicker than 10 nanometers. After the etching, the substrate 1 was heated up to 350° to 400° C. under a pressure lower than $1\times10^{-9}$ Torr to clean up the surface of the $Pr_1Ba_2Cu_3O_{7-y}$ oxide layer 3. This heat-treatment was not necessary, if the surface of the $Pr_1Ba_2Cu_3O_{7-y}$ oxide layer 3 was clean enough.

Figure 1D:
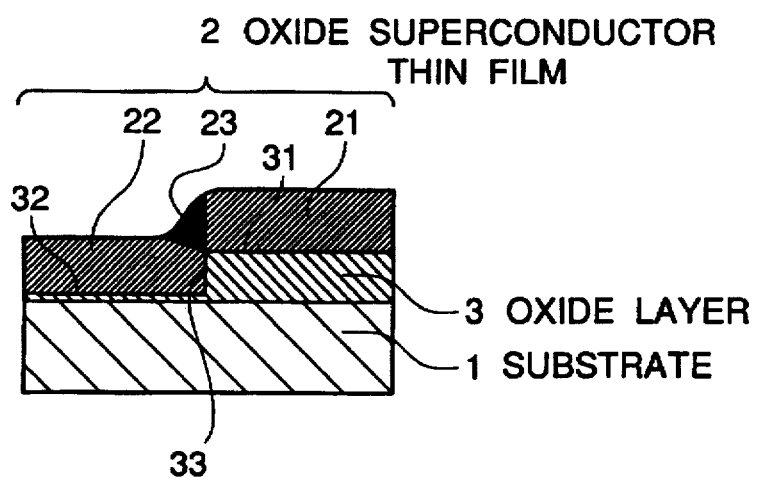

Thereafter, as shown in FIG. 1D, a $Y_1Ba_2Cu_3O_{7-x}$ oxide superconductor thin film 2 having a thickness of 200 nanometers was deposited over the $Pr_1Ba_2 Cu_3O_{7-y}$ oxide layer 3 by a sputtering process. The conditions of the sputtering process were as follows:

| Temperature of substrate | | 700° C. |
|---|---|---|
| Sputtering gas | Ar | 9 sccm |
| | $O_2$ | 1 sccm |
| Pressure | | $5 \times 10^{-2}$ Torr |

The $Y_1Ba_2Cu_3O_{7-x}$ oxide superconductor thin film 2 can be formed by MBE (molecular beam epitaxy), vacuum evaporation, laser ablation, etc., for example.

A step-edge junction was formed on the step 33 of the $Pr_1Ba_2Cu_3O_{7-y}$ oxide layer 3, which constitutes a Josephson junction. In this case, the step-edge junction had a grain boundary 23. Two parts 21 and 22 of the oxide superconductor thin film 2 which are positioned on a portion 31 and an etched portion 32 of $Pr_1Ba_2Cu_3O_{7-y}$ oxide layer 3 constituted superconducting electrodes which were linked by the grain boundary of the step-edge junction. The two parts 21 and 22 of oxide superconductor thin film 2 were formed of single crystalline $Y_1Ba_2Cu_3O_{7-x}$ oxide superconductor of which crystalline directions were the same as each other.

The $Y_1Ba_2Cu_3O_{7-x}$ oxide superconductor thin film 2 could be etched so as to form the narrow portion between portions 21 and 22, the center of which the grain boundary 23 crosses. Metal electrodes might be formed on the portions 21 and 22, if necessary. With this, the Josephson junction device in accordance with the present invention was completed.

A current-voltage characteristic of the above mentioned Josephson junction device was measured at a temperature of 85° K. When a microwave was irradiated, clear Shapiro steps were observed, and therefore, it could be ascertained that the Josephson junction was realized in the device.

As explained above, the Josephson junction device manufactured in accordance with the first embodiment of the method of the present invention is composed of two superconducting electrodes of single-crystalline oxide superconductor, which grow at the same time and form a sheet of the oxide superconductor thin film and which have the same crystalline direction as each other, and a grain boundary of the step-edge junction between them. The Josephson junction of the device is formed of a self-generated grain boundary of the step-edge junction. Accordingly, the limitation in the fine processing technique required for manufacturing the Josephson junction device is relaxed.

Embodiment 2

Referring to FIGS. 2A to 2F, a second embodiment of the process for manufacturing the Josephson junction device will be described.

Figure 2A:
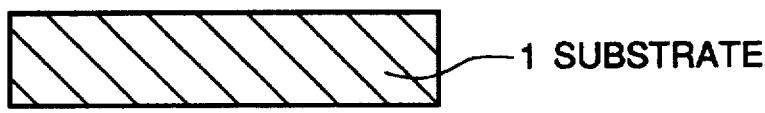
FIGS. 2A to 2F are diagrammatic views for illustrating a second embodiment of the process for manufacturing the Josephson junction device in accordance with the present invention.
Figure 2B:
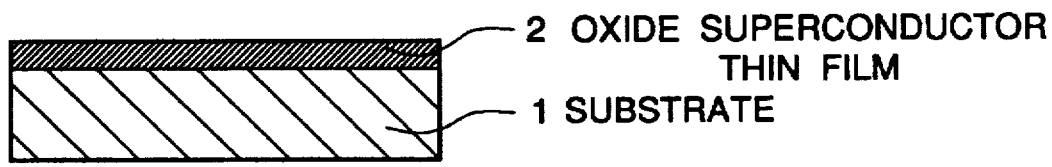

As shown in FIG. 2A, an MgO (100) substrate 1 having a size of 15 mm×8 mm and a thickness of 0.5 mm, similar to that of Embodiment 1 was prepared. As shown in FIG. 2B, a $Y_1Ba_2Cu_3O_{7-x}$ oxide superconductor thin film having a thickness 200 nanometers, was formed on the substrate 1 by an MBE process. The conditions of the MBE process were as follows:

| Temperature of substrate | | 700° C. |
|---|---|---|
| Oxidation gas | $O_3$ | 8% |
| | $O_2$ | 92% |
| Pressure | | $1 \times 10^{-5}$ Torr |

Figure 2C:
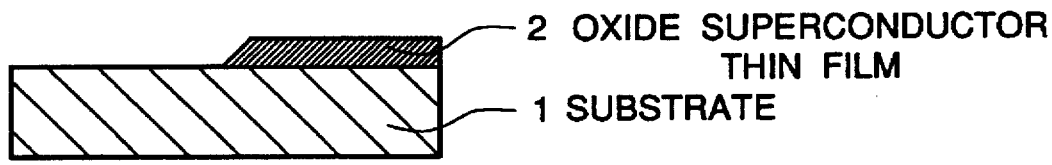

Thereafter, as shown in FIG. 2C, a left half portion of the $Y_1Ba_2Cu_3O_{7-x}$ oxide superconductor thin film 2 was completely removed by etching by an ion milling using argon (Ar) ions so as to form a slant step having a tilt angle of 40°. The $Y_1Ba_2Cu_3O_{7-x}$ oxide superconductor thin film 2 can be etched by a reactive ion etching or wet etching.

Figure 2D:
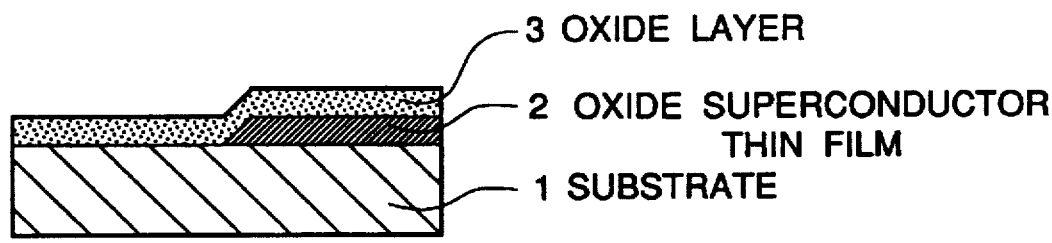

Then, as shown in FIG. 2D, a $Pr_1Ba_2Cu_3O_{7-y}$ oxide layer 3 having a thickness of 200 nanometers was deposited over the substrate 1 by an MBE process. The conditions of the MBE process were as follows:

| Temperature of substrate | | 750° C. |
|---|---|---|
| Oxidation gas | $O_3$ | 8% |
| | $O_2$ | 92% |
| Pressure | | $1 \times 10^{-5}$ Torr |

Figure 2E:
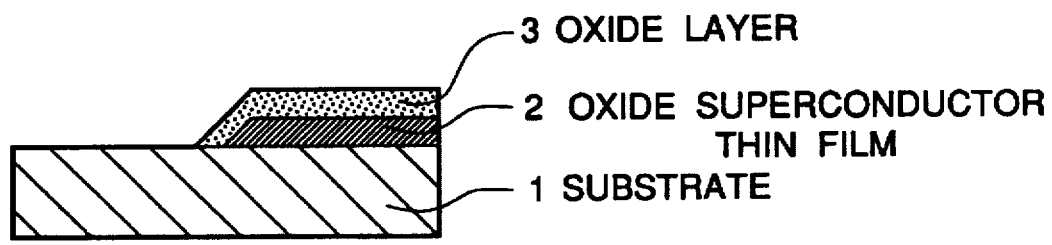

Thereafter, as shown in FIG. 2E, a left half portion of the $Pr_1Ba_2Cu_3O_{7-y}$ oxide layer 3 was completely removed by etching by an ion milling using Ar ions so as to leave a portion of the $Pr_1Ba_2Cu_3O_{7-y}$ oxide layer 3 covering the $Y_1Ba_2Cu_3O_{7-x}$ oxide superconductor thin film 2. The $Pr_1Ba_2Cu_3O_{7-y}$ oxide layer 3 also had a slant step having a tilt angle of 40°. The slant step portion of the $Pr_1Ba_2Cu_3O_{7-y}$ oxide layer 3 had a thickness of 50 nanometers. The $Pr_1Ba_2Cu_3O_{7-y}$ oxide layer 3 can be also etched by a reactive ion etching or wet etching.

Figure 2F:
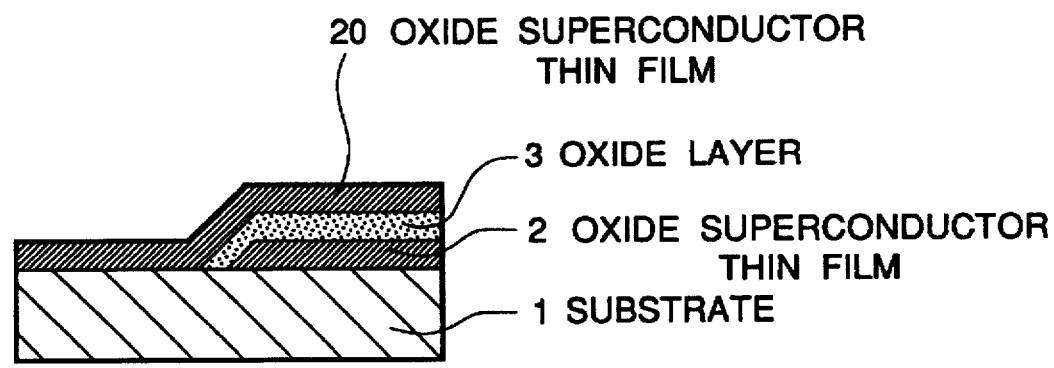

Then, a $Y_1Ba_2Cu_3O_{7-x}$ oxide superconductor thin film 20 having a thickness of about 200 nanometers was deposited over the substrate 1 by MBE to complete the Josephson junction device, as shown in FIG. 2F. The conditions of the MBE were the same as the above.

Since the step was inclined at 40°, the $Y_1Ba_2Cu_3O_{7-x}$ oxide superconductor thin film 20 did not have a grain boundary formed therein. A ramp edge junction forming a Josephson junction was formed between the $Y_1Ba_2Cu_3O_{7-x}$ oxide superconductor thin films 2 and 20. Although the $Pr_1Ba_2Cu_3O_{7-y}$ oxide layer 3 had a thickness of at least 50 nanometers, tunnel current could be flowed between thin films 2 and 20 by the long range proximity effect. Therefore, the ramp edge junction formed a Josephson junction.

A current-voltage characteristic of the above mentioned Josephson junction device was measured at a temperature of 85° K. When a microwave was irradiated, clear Shapiro steps were observed, and therefore, it could be ascertained that the Josephson junction was realized in the device.

Embodiment 3

Referring to FIGS. 3A to 3G, a third embodiment of the process for manufacturing the Josephson junction device will be described.

Figure 3A:
FIGS. 3A-3G are diagrammatic views for illustrating a third embodiment of the process for manufacturing the Josephson Junction device in accordance with the present invention.
Figure 3B:
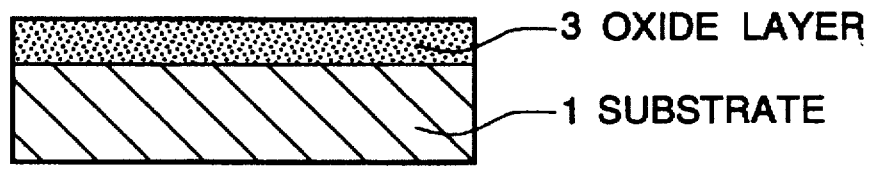

As shown in FIG. 3A, an MgO (100) substrate 1 having a size of 15 mm×8 mm and a thickness of 0.5 mm, similar to that of Embodiment 1 was prepared. As shown in FIG. 3B, a $Pr_1Ba_2Cu_3O_{7-y}$ oxide layer 3, having a thickness of 50 nanometers, was formed on the substrate 1 by an MBE process. The conditions of the MBE process were as follows:

| Temperature of substrate | | 750° C. |
|---|---|---|
| Oxidation gas | $O_3$ | 8% |
| | $O_2$ | 92% |
| Pressure | | $1 \times 10^{-5}$ Torr |

Figure 3C:
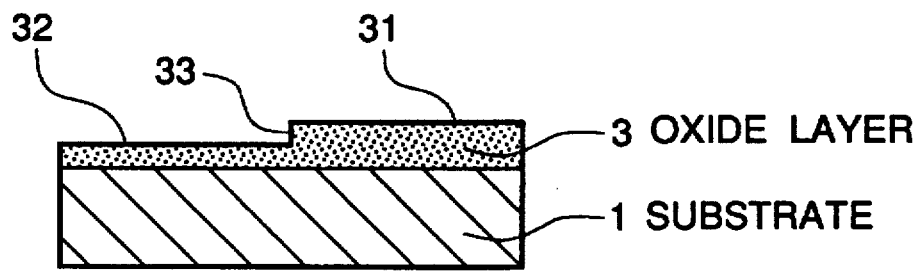

Thereafter, as shown in FIG. 3C, a portion 32 of the $Pr_1Ba_2Cu_3O_{7-y}$ oxide layer 3 was etched by an ion milling using Ar ions so as to form a step 33. The step 33 had a height of 25 nanometers. The height of the step 33 was, and is preferably, substantially the same as the thickness of the oxide superconductor thin films and oxide thin films which are subsequently formed on the $Pr_1Ba_2Cu_3O_{7-y}$ oxide layer 3. The $Pr_1Ba_2Cu_3O_{7-y}$ oxide layer 3 can be etched by a reactive ion etching or wet etching. The etched portion 32 of the $Pr_1Ba_2Cu_3O_{7-y}$ oxide layer 3 had a thickness of on the order of 20 nanometers.

Figure 3D:
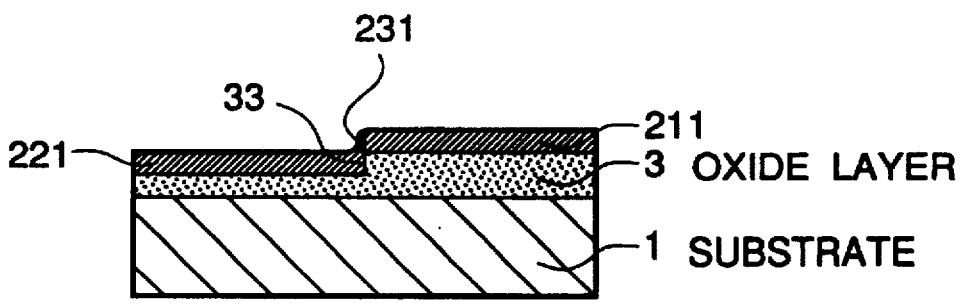

Then, as shown in FIG. 3D, a first $Y_1Ba_2Cu_3O_{7-x}$ oxide superconductor thin film 211 having a thickness of 25 nanometers was deposited over the $Pr_1Ba_2Cu_3O_{7-y}$ oxide layer 3 by an MBE process. A grain boundary 231 of a step-edge junction was formed at the step portion of the $Y_1Ba_2Cu_3O_{7-x}$ oxide superconductor thin film 211 like that of Embodiment 1. The conditions of the MBE process were as follows:

| Temperature of substrate | | 700° C. |
|---|---|---|
| Oxidation gas | $O_3$ | 8% |
| | $O_2$ | 92% |
| Pressure | | $1 \times 10^{-5}$ Torr |

Figure 3E:
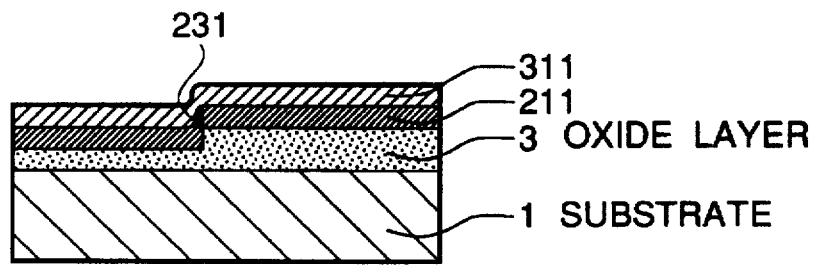

Then, the Y molecular beam source was exchanged to a Pr molecular beam source so that a first oxide thin film 311 composed of $Pr_1Ba_2Cu_3O_{7-y}$ oxide having a thickness of about 25 nanometers was continuously formed on the $Y_1Ba_2Cu_3O_{7-x}$ oxide superconductor thin film 211, as shown in FIG. 3E. The conditions of the MBE process were as follows:

| Temperature of substrate | | 700° C. |
|---|---|---|
| Oxidation gas | $O_3$ | 8% |
| | $O_2$ | 92% |
| Pressure | | $1 \times 10^{-5}$ Torr |

Thereafter, the Pr molecular beam source was exchanged to a Y molecular beam source so that a second $Y_1Ba_2Cu_3O_{7-x}$ oxide superconductor thin film was continuously formed on the first $Pr_1Ba_2Cu_3O_{7-y}$ oxide thin film 311.

Figure 3F:
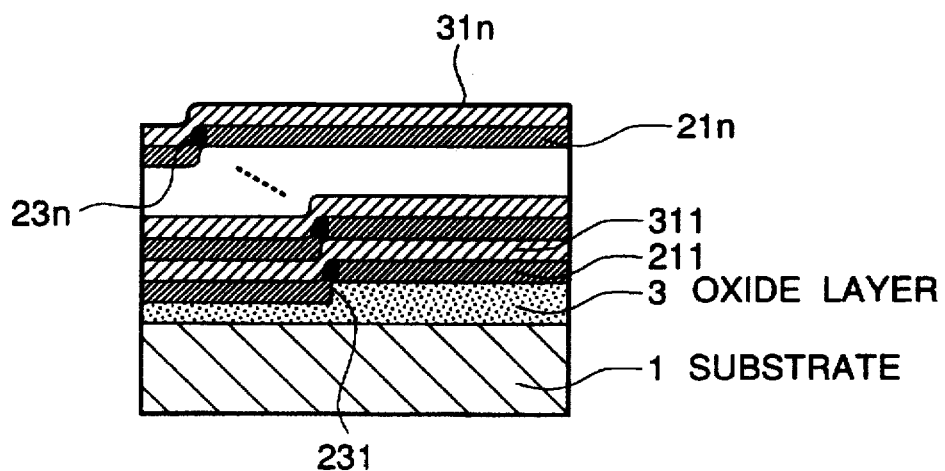
Figure 3G:
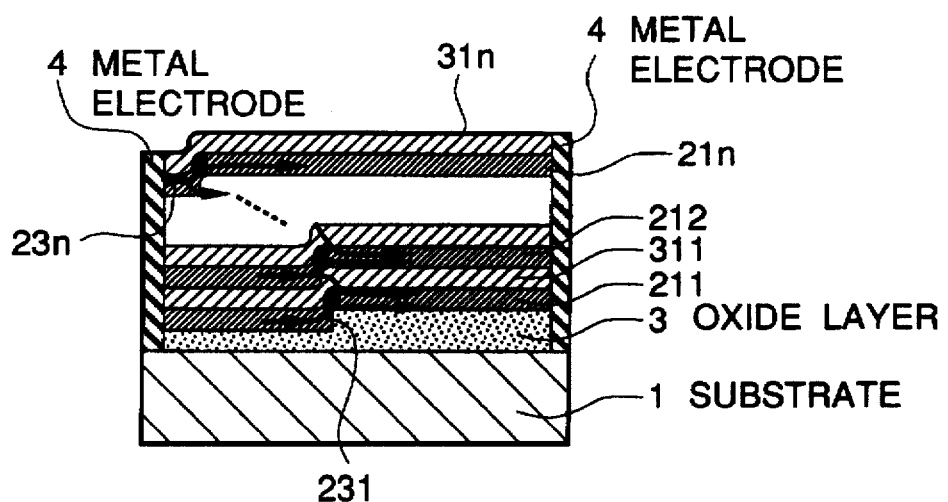

The above operation was repeated so that n layers of $Y_1Ba_2Cu_3O_{7-x}$ oxide superconductor thin films 211 to 21n and n layers of $Pr_1Ba_2Cu_3O_{7-y}$ oxide thin films 311 to 31n were stacked alternately on one another, as shown in FIG. 3F. The $Pr_1Ba_2Cu_3O_{7-y}$ oxide thin film 31n which was formed at the top was a protective layer. In this embodiment, ten (10) $Y_1Ba_2Cu_3O_{7-x}$ oxide superconductor thin films and $Pr_1Ba_2Cu_3O_{7-y}$ oxide thin films were stacked.

Finally, metal electrodes 4 were formed at both sides of the stacked structure of the $Y_1Ba_2Cu_3O_{7-x}$ oxide superconductor thin films 211 to 21n and the $Pr_1Ba_2Cu_3O_{7-y}$ oxide thin films 311 to 31n. With this, the Josephson junction device in accordance with the present invention was completed.

In the above Josephson junction device, $Y_1Ba_2Cu_3O_{7-x}$ oxide superconductor thin films 211 to 21n had grain boundaries 231 to 23n of step-edge junctions at their step portions each of which constitutes a Josephson junction. These Josephson junctions were constituted of self-generated grain boundaries of step-edge junctions so that they have substantially the same characteristics as each other. Therefore, the Josephson junction device had integrated multiple homogeneous Josephson junction.

In addition, ramp edge junctions like that of Embodiment 2 were formed between the adjacent $Y_1Ba_2Cu_3O_{7-x}$ oxide superconductor thin films, which also constituted Josephson junctions. Therefore, in the above Josephson junction device, current was able to flow through the step-edge junctions and the ramp edge junctions as represented by the arrows shown in FIG. 3G, so as to increase current capability of the device. In addition, synthesis of the step-edge junctions and the ramp edge junctions would cancel or nullify variations in the properties of the layers of the stacked structure, so that the Josephson junction device had stable properties.

A current-voltage characteristic of the above mentioned Josephson junction device was measured at a temperature of 85° K. When a microwave was irradiated, clear Shapiro steps were observed, and therefore, it could be ascertained that the Josephson junction was realized in the device.

Of course, the limitation in the fine processing technique required for manufacturing the Josephson junction device is relaxed, as in the Josephson junction device of Embodiment 1.

In the above mentioned embodiments, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but changes and modifications may be made, and the scope of the invention is to be determined by reference to the appended claims.

What is claimed:

1. A Josephson junction device comprising a single crystalline substrate including a principal surface, an oxide layer formed on the principal surface of the substrate, said oxide layer having a substantially perpendicularly oriented step on an upper surface, a plurality of oxide superconductor thin films and non-superconductive oxide thin films alternately formed on the upper surface of the oxide layer, in which a thickness of each of said oxide superconductor thin films and of each of said oxide thin films is the same, wherein each oxide superconductor thin film includes a step, with a first and a second portion of said oxide superconductor thin film respectively positioned above and below the step, said first and second portions of said oxide superconductor thin film being constituted of single crystals of oxide superconductor material having an identical crystal orientation, and a step-edge junction comprising a grain boundary on the step of the oxide layer, which constitutes a weak link of the Josephson junction service wherein said thickness of each of said oxide thin films is of a dimension permitting tunnel current to flow therethrough between oxide superconductor thin films disposed on upper and lower surfaces of each of said oxide thin films, thereby forming a ramp each of said oxide thin films, thereby forming a ramp edge junction functioning as a Josephson junction.

2. A Josephson junction device comprising a single crystalline substrate including a principal surface, an oxide layer formed on the principal surface of the substrate, said oxide layer having a substantially perpendicularly oriented step on an upper surface, a plurality of oxide superconductor thin films and non-superconductive oxide thin films alternately formed on the upper surface of the oxide layer, in which a thickness of each of said oxide superconductor thin films and of each of said oxide thin films is the same, wherein each oxide superconductor thin film includes a step, with a first and a second portion of said oxide superconductor thin film respectively positioned above and below the step, said first and second portions of said oxide superconductor thin film being constituted of single crystals of oxide superconductor material having an identical crystal orientation, a step-edge junction comprising a grain boundary on the step of the oxide layer, which constitutes a weak link of the Josephson junction device and a first and a second electrodes separately disposed at the ends of said first and second portions of said oxide superconductor thin films in contact with said first and second portions of said oxide superconductor thin films, and wherein said first end and said second end are opposing ends.

3. A Josephson junction device as recited in claim 2 wherein a height of the step of the oxide layer is the same as the thickness of the oxide superconductor thin film and oxide thin film.

4. A Josephson junction device as recited in claim 2, wherein the oxide thin film is formed of a $Pr_1Ba_2Cu_3O_{7-y}$ oxide.

* * * * *